US010122321B2

(12) United States Patent
Ulian et al.

(10) Patent No.: US 10,122,321 B2
(45) Date of Patent: Nov. 6, 2018

(54) FREQUENCY CONVERSION DEVICE WITH DUAL LOCAL OSCILLATORS AND SATELLITE PAYLOAD COMPRISING SUCH A DEVICE

(71) Applicant: THALES, Courbevoie (FR)

(72) Inventors: Patrice Ulian, Toulouse (FR); Juliette Vallon-Altairac, Toulouse (FR); Jean-Brice Juraver, Toulouse (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 15/676,647

(22) Filed: Aug. 14, 2017

(65) Prior Publication Data

US 2018/0062577 A1 Mar. 1, 2018

(30) Foreign Application Priority Data

Aug. 23, 2016 (FR) .................... 16 01250

(51) Int. Cl.
| | |
|---|---|
| H03D 7/16 | (2006.01) |
| B64G 1/42 | (2006.01) |
| H03D 7/12 | (2006.01) |
| H04B 7/185 | (2006.01) |

(52) U.S. Cl.
CPC ............ *H03D 7/161* (2013.01); *B64G 1/428* (2013.01); *H03D 7/12* (2013.01); *H04B 7/18515* (2013.01)

(58) Field of Classification Search
CPC ..... H03D 7/161; H04B 7/18515; H04B 17/40

USPC ......................................... 327/361
See application file for complete search history.

(56) References Cited

U.S. PATENT DOCUMENTS

| | | | | |
|---|---|---|---|---|
| 4,002,980 A | | 1/1977 | Herz | |
| 5,963,845 A | | 10/1999 | Floury et al. | |
| 6,038,431 A | * | 3/2000 | Fukutani | H03J 1/005 |
| | | | | 375/316 |
| 6,996,057 B2 | * | 2/2006 | Harris | H04B 17/15 |
| | | | | 370/217 |
| 7,277,727 B1 | * | 10/2007 | Rausch | H04B 10/25759 |
| | | | | 455/119 |
| 7,392,134 B2 | * | 6/2008 | Tauchi | G01C 21/26 |
| | | | | 340/988 |
| 8,160,502 B2 | * | 4/2012 | Shen | H04B 17/13 |
| | | | | 455/118 |
| 9,473,236 B2 | * | 10/2016 | Fujimura | H04B 17/40 |
| 2009/0160397 A1 | | 6/2009 | Diraison et al. | |

FOREIGN PATENT DOCUMENTS

EP 2 014 553 A2 1/2009

* cited by examiner

*Primary Examiner* — Dinh T Le

(74) *Attorney, Agent, or Firm* — Baker & Hostetler LLP

(57) ABSTRACT

A frequency conversion device, intended for installation on board a satellite, comprises an active assembly comprising at least one first radiofrequency processing chain comprising a first mixer, a first local oscillator operating at a first frequency and linked to the first mixer, at least one second radiofrequency processing chain comprising a second mixer, and a second local oscillator operating at a second frequency and linked to the second mixer and a current or voltage converter for supplying power to the active assembly.

7 Claims, 5 Drawing Sheets

FREQUENCY CONVERSION DEVICE WITH DUAL LOCAL OSCILLATORS AND SATELLITE PAYLOAD COMPRISING SUCH A DEVICE

CROSS-REFERENCE TO RELATED APPLICATIONS

This application claims priority to foreign French patent application No. FR 1601250, filed on Aug. 23, 2016, the disclosure of which is incorporated by reference in its entirety.

FIELD OF THE INVENTION

The technical field of the invention relates to frequency converters incorporated in satellite payloads, in particular telecommunication satellites.

More specifically, the subject of the invention is a frequency converter with dual local oscillators.

BACKGROUND

Frequency converters are used on board telecommunication satellites for the purpose of frequency transposition in order to transmit signals to the ground over various frequency channels dictated by the telecommunications operator.

The number of different frequency channels to be managed may be very large and their allocation when coming from the ground and their allocation on the way back to the ground may vary, and thus the number of frequency converters on board a satellite may, as a consequence, be equally large.

In addition, in order to provide service continuity in the event of equipment failure, satellite operators dictate the use of redundant equipment which further increases the total amount of equipment that it is necessary to install on board a satellite.

In the light of these constraints, there is a general problem consisting in limiting the mass, volume and overall cost of the frequency converters incorporated in a satellite payload for the purpose of carrying out frequency conversion functions associated with the number of dictated frequency channels.

Current solutions providing a required level of reliability consist in incorporating, in a satellite payload, a certain number of additional frequency converters which remain switched off (inactive) until standing in for another, failing frequency converter.

These solutions entail substantial bulk, both in terms of mass and volume, for the payload since they require the addition of a non-negligible number of additional converters. Specifically, each converter uses a specific local oscillator operating at a certain frequency. A redundant converter can only stand in for a failing converter comprising the same type of local oscillator.

The invention proposes a solution for remedying the aforementioned drawbacks which consists in a frequency converter with dual local oscillators making it possible to control multiple frequency conversion chains with one and the same local oscillator and thus make savings in terms of mass, volume and cost on the equipment installed on board the satellite.

SUMMARY OF THE INVENTION

One subject of the invention is a frequency conversion device, intended for installation on board a satellite, comprising an active assembly comprising at least one first radiofrequency processing chain comprising a first mixer, a first local oscillator operating at a first frequency and linked to the first mixer, at least one second radiofrequency processing chain comprising a second mixer, and a second local oscillator operating at a second frequency and linked to the second mixer and a current or voltage converter for supplying power to the active assembly.

According to one particular aspect, the device according to the invention comprises an inactive redundant assembly comprising at least one third radiofrequency processing chain comprising a third mixer, a third local oscillator operating at the first frequency and linked to the third mixer, at least one fourth radiofrequency processing chain comprising a fourth mixer, and a fourth local oscillator operating at the second frequency and linked to the fourth mixer.

According to one particular aspect, the device according to the invention comprises a distribution system for linking each local oscillator of the active assembly and of the inactive redundant assembly to a mixer of each radiofrequency processing chain.

According to one particular aspect of the invention, the first frequency and the second frequency are different.

According to one particular aspect, the device according to the invention comprises a plurality of switches for connecting the inputs/outputs of the device to the inputs/outputs of the active radiofrequency processing chains.

According to one particular aspect of the invention, the current or voltage converter, a first radiofrequency processing chain, a first local oscillator, a second radiofrequency processing chain and a second local oscillator are grouped together within one and the same unit, the device according to the invention comprising a plurality of said units, each unit being made either active or inactive and redundant.

According to one particular aspect, the device according to the particular variant of the invention comprises a plurality of switches for connecting the inputs/outputs of the device to the inputs/outputs of the active units.

Another subject of the invention is a satellite payload comprising a frequency conversion device according to the invention.

BRIEF DESCRIPTION OF THE DRAWINGS

Other features and advantages of the present invention will become more clearly apparent upon reading the following description with reference to the appended drawings, which represent.

DETAILED DESCRIPTION

Figure 1:
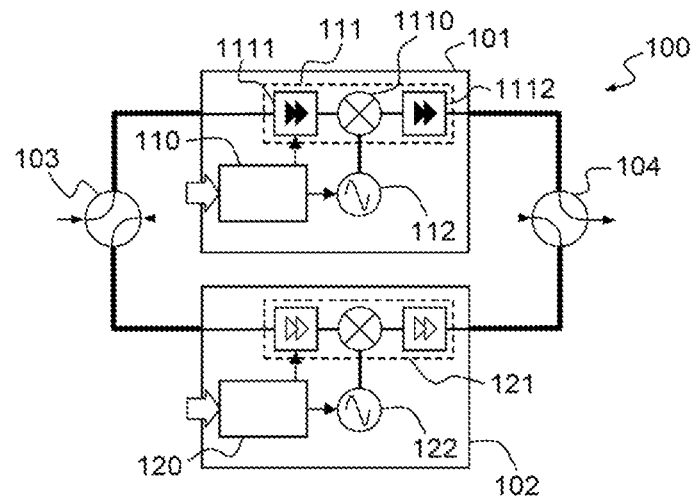
FIGS. 1 and 2, two diagrams showing a ring of frequency converters comprising one active chain (FIG. 1) and three active chains (FIG. 2) according to a first solution of the prior art.
Figure 2:
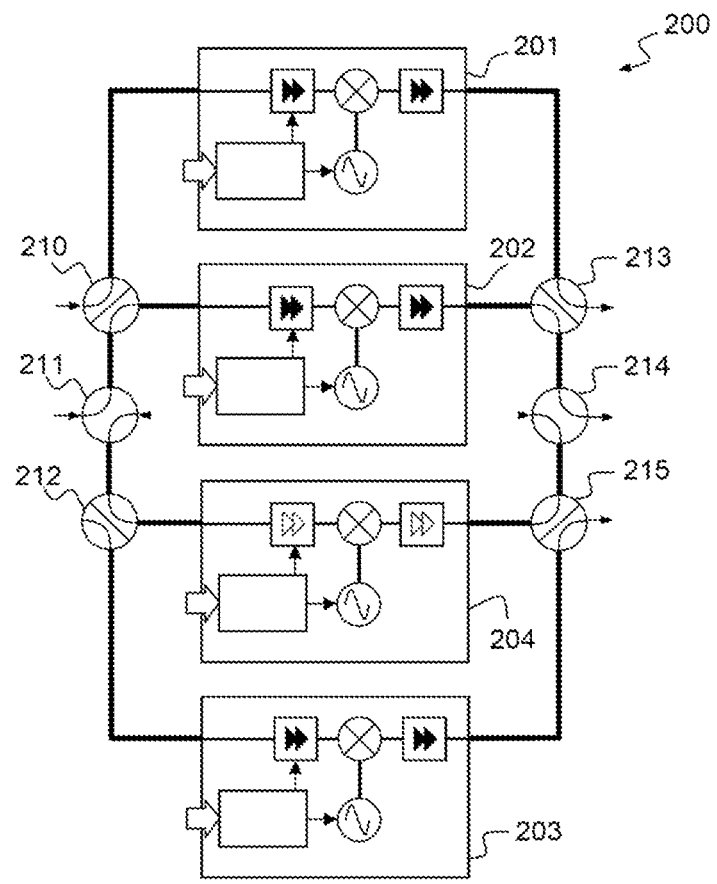

FIGS. 1 and 2 show two examples of frequency conversion systems according to a first technique of the prior art.

FIG. 1 describes a frequency converter device 100 intended to carry out frequency transposition for a signal broadcast over a frequency channel. The frequency transposition operation consists in obtaining, as output from the device 100, a signal at a frequency $F_s=F_e+F_{OL}$, where $F_e$ is the frequency of the signal as input to the device 100 and $F_{OL}$ is the frequency of the local oscillator 112, 122 used to carry out the frequency conversion. Alternatively, the operation may also be carried out by subtracting the frequency of the local oscillator $F_{OL}$ from the input frequency $F_e$ of the device, where $F_s=F_e-F_{OL}$.

According to the example of FIG. 1, the frequency converter device 100 comprises a first unit 101 comprising a current or voltage converter 110 capable of producing a DC current at a given intensity or a DC voltage at a given voltage for the purpose of supplying power to the unit 101. The current or voltage converter 110 supplies power to a frequency conversion chain 111 and a local oscillator 112 producing the frequency $F_{OL}$. The frequency conversion chain 111 comprises at least one mixer 1110 for transposing the frequency of the signal received as input by the device on the basis of the frequency of the local oscillator 112. The frequency conversion chain 111 may also comprise one or more filters and amplifiers 1111, 1112.

In order to provide service continuity in the event of failure of the first unit 101, the frequency converter device 100 also comprises a second unit 102, identical to the first unit 101, but used as a redundant unit. The second unit is inactive while the first unit 101 is active. If the first unit 101 becomes faulty, the second unit 102 is activated. A unit is deactivated by switching off its power supply. Thus, an inactive unit is spared wear over time and exhibits increased reliability for being used to stand in for a faulty active unit.

The activation of the first unit 101 or of the second unit 102 may be accompanied in particular by the switching of multiple switches 103, 104 which are arranged so as to connect the input (or the output) of the frequency converter device 100 to the input (or the output) of the first unit 101 or of the second unit 102.

The second unit 102 is identical to the first unit 101 and to this end comprises a current or voltage converter 120, a frequency conversion chain 121 and a local oscillator 122 capable of generating the same frequency $F_{OL}$ as the local oscillator 112 of the first unit 101.

FIG. 2 shows another example of the frequency converter device 200 of the prior art. In this example, the device 200 comprises three active units 201, 202, 203 and one inactive redundant unit 204. The three active units are used to transpose three different signals, corresponding for example to three separate frequency channels, with the same transposition frequency $F_{OL}$.

Each unit 201-204 is identical to the two units described for the device of FIG. 1. The device 200 includes multiple switches 210, 211, 212, 213, 214, 215 in order to manage the connections between the three inputs (or three outputs) of the device 200 and the three inputs (or three outputs) of the three active units 201, 202, 203.

The examples of FIGS. 1 and 2 illustrate the issue of bulk, in terms of mass and volume, linked to the multiplication of frequency converters installed on board a satellite in order to manage, not only a multiplicity of signals each requiring a frequency transposition operation, but also the requirement to have, in addition, redundant units on board in order to provide service continuity with a high level of reliability.

Typically, a satellite payload may have multiple frequency converter devices on board, each associated with a different signal to be transposed, dictating the presence of many tens of frequency converters on board. In addition, reliability constraints dictate at least one redundant unit per active unit.

Thus, there is the problem of the bulk (mass and volume) caused by the multitude of converters required. It is therefore necessary to find a solution allowing the mass and volume of the assembly of devices to be decreased while retaining the same required level of reliability with respect to the required redundancy.

Figure 3:
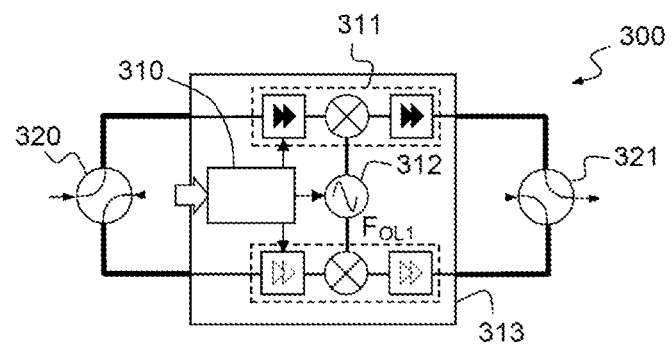
FIGS. 3 and 4, two diagrams showing a ring of frequency converters comprising one active chain (FIG. 3) and three active chains (FIG. 4) according to a second solution of the prior art.
Figure 4:
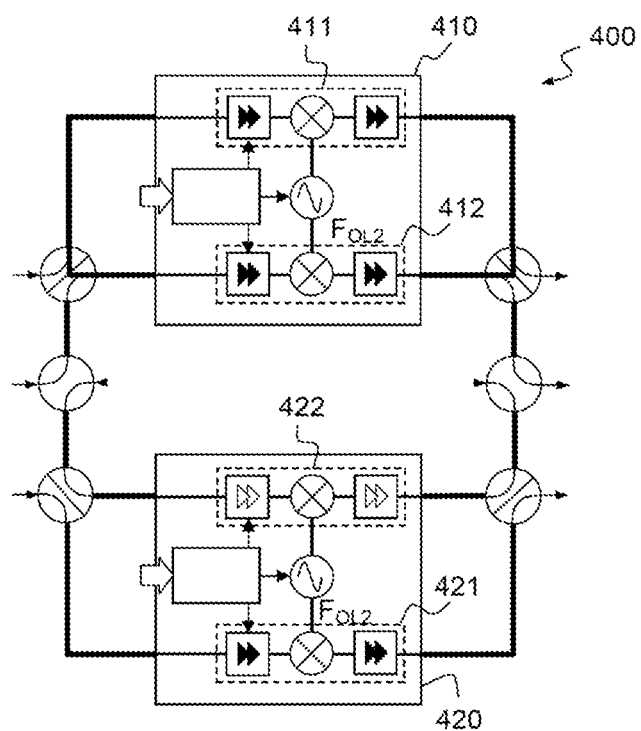

FIGS. 3 and 4 show two other examples of frequency converters according to another technique of the prior art.

In order to limit the overall bulk, in terms of mass and volume, generated by the assembly of frequency converters on board a satellite, one solution consists in producing converters with dual frequency transposition chains. Such a device 300 is described in FIG. 3. It comprises two frequency transposition chains 311, 313 which are each supplied by the same current or voltage converter 310 and by one and the same local oscillator 312. A first frequency transposition chain 311 is activated while the second chain 313 is deactivated. A system of switches 320, 321 allows, in a similar manner to the device of FIG. 1, the inputs/outputs of the device 300 to be connected to the inputs/outputs of the active transposition chain 311.

The device 300 of FIG. 3 allows the bulk (mass and volume) to be decreased by using a single current or voltage converter 310 and a single local oscillator 312 for two transposition chains 311, 313.

FIG. 4 shows another exemplary application of the device described in FIG. 3 but this time in order to manage three active transposition chains and one inactive redundant chain. In this case, the device 400 according to FIG. 4 comprises a first unit 410 comprising two active chains 411, 412 and a second unit 420 comprising one active chain 421 and one inactive chain 422.

A system of switches identical to that used for the device of FIG. 2 is used to connect the inputs and outputs of the device to the inputs and outputs of the active chains.

One drawback of the frequency conversion device with dual transposition chains such as described in FIGS. 3 and 4 is that it does not provide strict redundancy by completely separating the active units from the inactive units. In the case of the device of FIG. 2, the redundancy amounts to one additional unit to make up for a fault in one out of three other units. Specifically, in the case of the device of FIG. 4, the redundancy is no more than one additional unit to make up for a fault in just one other unit. Specifically, if one transposition chain is faulty, the architecture of the device of FIG. 4 may ultimately lead to both transposition chains becoming faulty since they are co-localized within the same device.

In addition, the concept of redundancy most often involves, in order to provide optimal reliability, the redundant unit being completely switched off in order to safeguard its operation. In the case of a device with dual transposition chains, only a portion of the device is switched off, which does not provide the same level of operational reliability as the redundant device.

Figure 5:
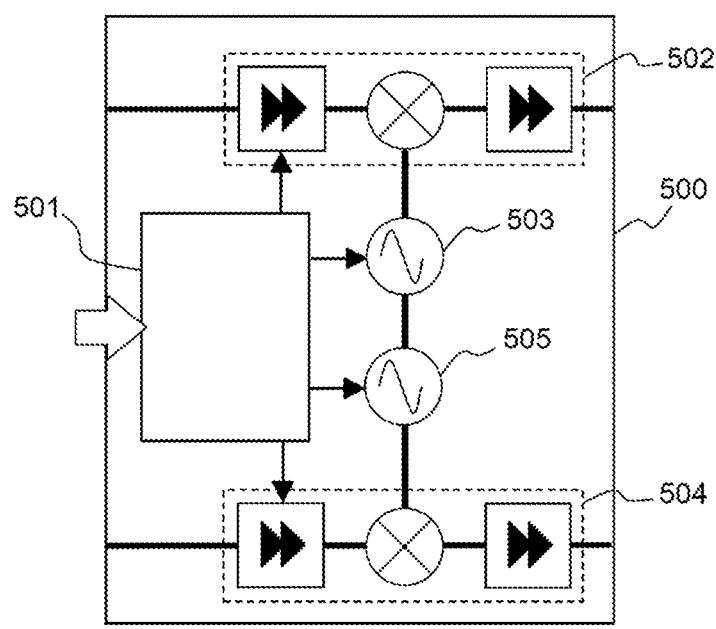
FIG. 5, a diagram showing a frequency conversion device with dual local oscillators according to a first embodiment of the invention.

FIG. 5 describes a frequency conversion device with dual transposition chains and dual local oscillators according to a first embodiment of the invention.

The device 500 according to the invention comprises a single current or voltage converter 501 which supplies power to two frequency conversion chains 502, 504 and to two local oscillators 503, 505 which each controls one of the two chains. The frequency conversion chains 502, 504 are identical to those already described in FIG. 1 and comprise at least one mixer and, optionally, at least one filter and/or at least one amplifier.

The frequencies of the two local oscillators 503, 505 may be identical or different.

The device according to the invention described in FIG. 5 allows multiple frequency transposition functions with two different conversion frequencies to be carried out within one and the same satellite payload. The device according to the invention allows bulk (mass and volume) to be saved by using one and the same current or voltage converter to supply power to two frequency conversion chains and to two local oscillators. In addition, the device according to the invention makes it possible, unlike the solutions of the prior art described in FIGS. 3 and 4, to provide a strict redundancy, referred to as cold redundancy, for the units as illustrated in the example of FIG. 6.

Figure 6:
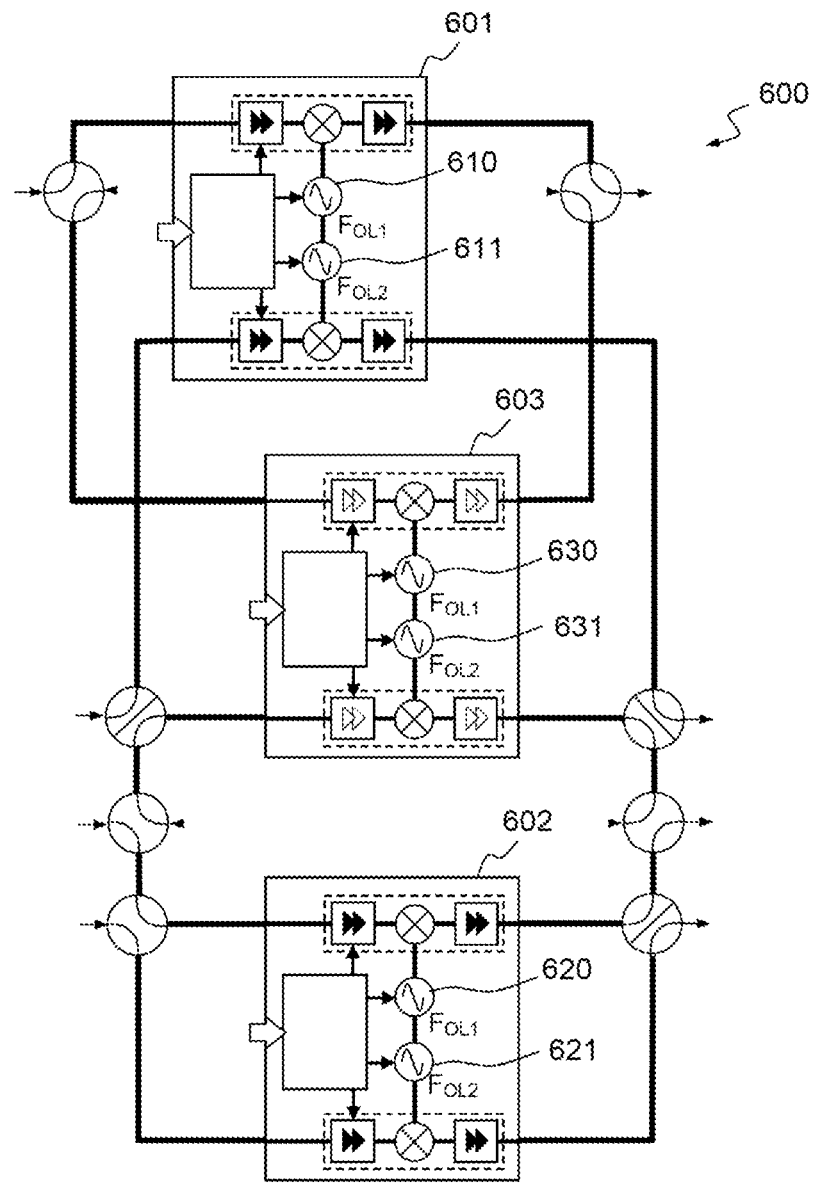
FIG. 6, a diagram showing a first use of the frequency conversion device of FIG. 3 to produce a more complex system managing an active chain at a first frequency and three active chains at a second frequency.

FIG. 6 describes an assembly 600 of frequency converters comprising three devices 601, 602, 603 of the type of FIG. 5.

The assembly 600 allows the same frequency conversion functions to be carried out as the two devices of FIGS. 3 and 4, namely one conversion to a first frequency $F_{OL1}$ and three conversions to a second frequency $F_{OL2}$.

The first device 601 includes a first conversion chain controlled by a first local oscillator 610 producing the first frequency $F_{OL1}$ and a second conversion chain controlled by a second local oscillator 611 producing the second frequency $F_{OL2}$. The second device 602 includes two conversion chains, each controlled by a local oscillator 620, 621 producing the second frequency $F_{OL2}$. Lastly, the first device 603 includes a first conversion chain controlled by a first local oscillator 630 producing the first frequency $F_{OL1}$ and a second conversion chain controlled by a second local oscillator 631 producing the second frequency $F_{OL2}$.

The first device 601 and the second device 602 are active and together allow the first frequency conversion chain via the first frequency $F_{OL1}$ and the three frequency conversion chains via the second frequency $F_{OL2}$ to be carried out.

The third device 603 is used as a redundant device and is deactivated. It provides redundancy both for the chain for conversion to the first frequency $F_{OL1}$ and for the three chains for conversion to the second frequency $F_{OL2}$.

Unlike the system described in FIGS. 3 and 4, the device according to the invention makes it possible to provide strict redundancy, referred to as cold redundancy, in that one entire device 603 may be used as a redundant device. Bulk (mass and volume) is saved due to the fact that one and the same device can be used for one single conversion frequency or two different conversion frequencies.

Without departing from the scope of the invention, the device described in FIG. 5 may be used to produce more complex systems comprising a large number of frequency conversion chains.

Figure 7:
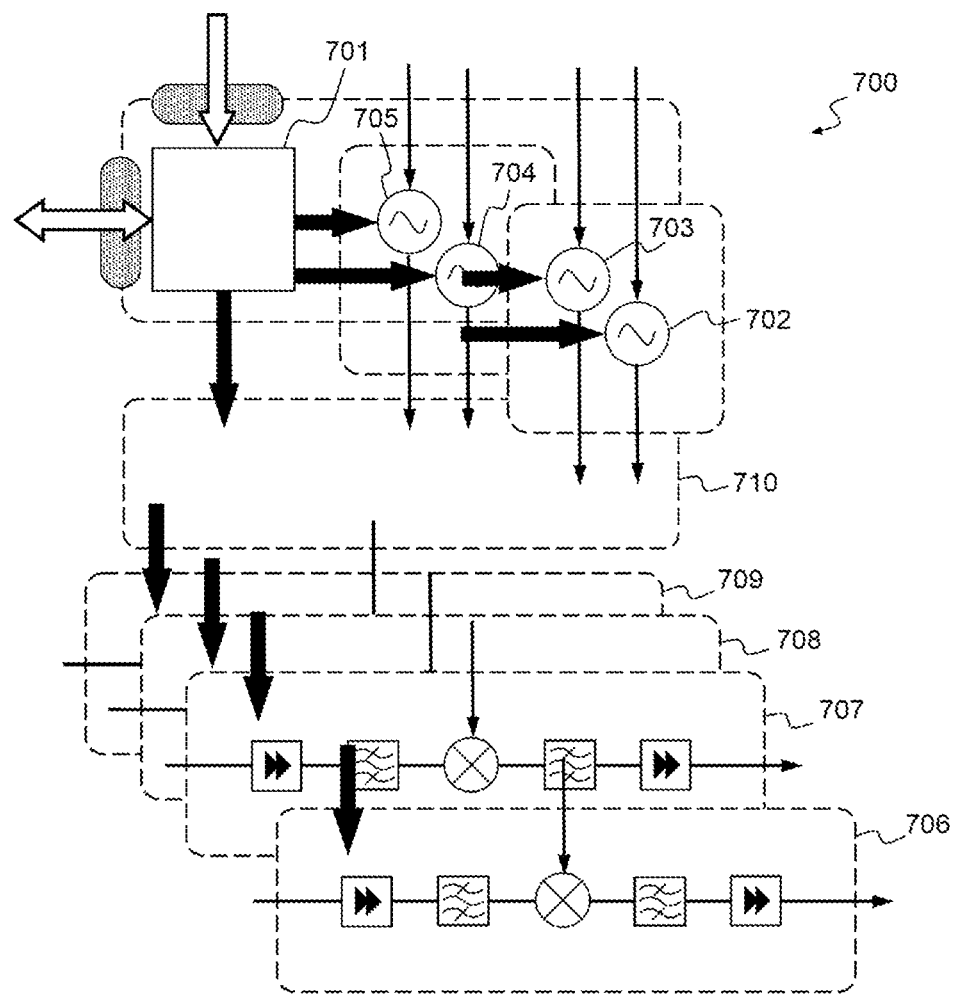
FIG. 7, a diagram showing a frequency conversion device with dual local oscillators according to a second embodiment of the invention.

FIG. 7 describes a frequency conversion device according to another embodiment of the invention.

The device 700 of FIG. 7 comprises an active current or voltage converter 701 for supplying power to the assembly of components of the device, an active first local oscillator 702 operating at a first frequency $F_{OL1}$, an active second local oscillator 703 operating at a second frequency $F_{OL2}$, a third local oscillator 704 operating at the first frequency $F_{OL1}$ and deactivated in order to provide redundancy for the first local oscillator 702, a fourth local oscillator 705 operating at the second frequency $F_{OL2}$ and deactivated in order to provide redundancy for the second local oscillator 703. The active current or voltage converter 701 may be made redundant by adding an inactive redundant second current or voltage converter in order to make up for a fault in the active converter 701.

The device 700 also comprises a plurality of frequency conversion chains 706-709 and a distribution system 710 in order to link the outputs of the various local oscillators 702-705 to the mixers of the various frequency conversion chains 706-709.

The device 700 of FIG. 7 is especially advantageous for the incorporation of a large number of frequency conversion chains. It allows one and the same current converter 701 to be shared by the assembly of chains and also makes it possible to provide strict redundancy for the local oscillators and the frequency conversion chains. In addition, it has the advantage of providing a high level of flexibility in terms of production since it is possible to produce a large number of combinations by varying the number of conversion chains associated with the first conversion frequency $F_{OL1}$ and with the second conversion frequency $F_{OL2}$ but also by varying the number of redundant conversion chains which are linked to the redundant local oscillators.

The invention claimed is:

1. A frequency conversion device, for installation on board of a satellite, comprising an active assembly comprising:
    at least one first radio-frequency processing chain comprising a first mixer,
    a first local oscillator operating at a first frequency and connected to the first mixer,
    at least one second radio-frequency processing chain comprising a second mixer,
    a second local oscillator operating at a second frequency and connected to the second mixer, and
    a current or voltage converter for supplying power to the active assembly,
    the current or voltage converter being connected to the at least one first radio-frequency processing chain, to the at least one second radio-frequency processing chain, to the first local oscillator, and to the second local oscillator, wherein:
    said current or voltage converter, said at least one first radio-frequency processing chain, said first local oscillator, said at least one second radio-frequency processing chain, and said second local oscillator, are grouped together within one and a same first unit, and
    the frequency conversion device comprising at least one additional unit that is identical to the first unit, each additional unit being configured to be either active or inactive and redundant.

2. The frequency conversion device according to claim 1, comprising an inactive redundant assembly comprising at least one third radio-frequency processing chain comprising a third mixer, a third local oscillator operating at the first frequency and connected to the third mixer, at least one fourth radio-frequency processing chain comprising a fourth mixer, and a fourth local oscillator operating at the second frequency and connected to the fourth mixer.

3. The frequency conversion device according to claim 2, comprising a distribution system for connecting each local oscillator of the active assembly and of the inactive redundant assembly to a respective mixer of each radiofrequency processing chain.

4. The frequency conversion device according to claim 2, wherein the first frequency and the second frequency are different.

5. The frequency conversion device according to claim 2, comprising a plurality of switches for connecting inputs/outputs of the frequency conversion device to inputs/outputs of the active radio-frequency processing chains.

6. The frequency conversion device according to claim 1, comprising a plurality of switches for connecting inputs/outputs of the frequency conversion device to inputs/outputs of the active units.

7. A satellite payload comprising a frequency conversion device according to claim 1.

* * * * *